United States Patent [19]

Asmussen

[11] Patent Number: 4,777,336
[45] Date of Patent: Oct. 11, 1988

[54] METHOD FOR TREATING A MATERIAL USING RADIOFREQUENCY WAVES

[75] Inventor: Jes Asmussen, Okemos, Mich.

[73] Assignee: Michigan State University, East Lansing, Mich.

[21] Appl. No.: 41,291

[22] Filed: Apr. 22, 1987

[51] Int. Cl.$^4$ .............................................. H05B 6/64
[52] U.S. Cl. ..................... 219/10.55 M; 219/10.55 A; 219/10.55 F
[58] Field of Search ................. 219/10.55 M, 10.55 A, 219/10.55 B, 10.55 F, 10.55 R, 10.43, 10.41, 10.81; 34/1

[56] References Cited

U.S. PATENT DOCUMENTS

| | | | |
|---|---|---|---|
| 3,461,401 | 8/1969 | Williams | 219/10.55 A X |
| 3,715,555 | 2/1973 | Johnson | 219/10.55 A |
| 4,099,042 | 7/1978 | Jean et al. | 219/10.55 A |
| 4,179,595 | 12/1979 | Chiron | 219/10.55 F |
| 4,196,332 | 4/1980 | MacKay et al. | 219/10.55 B |
| 4,276,462 | 6/1981 | Risman | 219/10.55 A X |
| 4,507,588 | 3/1985 | Asmussen et al. | |
| 4,585,688 | 4/1986 | Root et al. | |
| 4,616,120 | 10/1986 | Maruyama et al. | 219/10.55 A |

OTHER PUBLICATIONS

El-Sayed et al., J. of Microwave Power, 16, 283, (1981).
Osepchuk, IEEE Trans. Microwave Theory and Techniques, MTT-32, 1200, (1984).
(a)Huang, H. F., J. Microwave Power, 4, 289, (1969).
(b)Huang, H. F., J. Microwave Power, 11, 305, (1976).
Asmussen, J., et al., Proc. IEEE, 62, 109, (1974).
Asmussen, J., et al., Appl. Phys. Letter, 44, 396, (1984).
Root, J., et al., Rev. of Sci. Instrum, 56, 1511, (1985).
Whitehair, S., et al., Appl. Phys. Lett., 44, 1014, (1984).
Dahimene, M. et al., J. Vac Sci. Technol., B4, 126, (1986).
Von Hippel, A. R., et al., Dielectric Materials and Applications (MIT Press, Cambridge, MA., p. 361, (1954).
Ramos, S., et al., Fields and Waves in Commun. Elect., (Wiley, N.Y., 1967), p. 565.
Montgomery, D. G., Technique of Microwave Measurements, vol. I, (Dover Pub., N.Y., 1966), pp. 384-392.
Li, S., et al., IEEE Trans. Microwave Theory, MTT-29, 1041, (1981).
Rogers, J., Ph.D. Thesis, 1982, Michigan State University.
Roussey, et al., J. Microwave Power, 47, (1985).

*Primary Examiner*—Philip H. Leung
*Attorney, Agent, or Firm*—Ian C. McLeod

[57] ABSTRACT

A method (1) for determining and controlling patterns of change of heating as a function of time for controlled heating of similar materials B, Ba or Bb or (2) for determining changing dielectric constants of a material B, Ba or Bb during heating is described. The materials are heated in cavity (10 or 10a) using radiofrequency waves with internal tuning using a probe (19 or 19a) and sliding shorting plates (12 or 12a). In particular single mode or controlled multimode heating of the materials to allow programmed processing is described.

16 Claims, 16 Drawing Sheets

Equivalent Circuit

Processing System Components

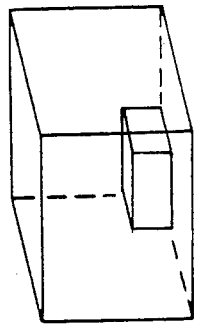
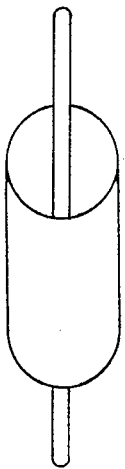
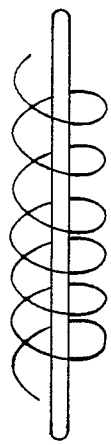
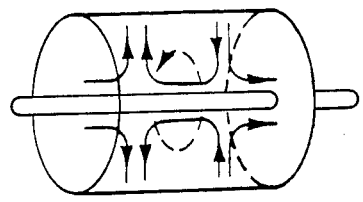
FIG. 2 — microwave oven — Multimode Cavity
FIG. 2A — circular guide — Waveguide Applicator
FIG. 2B — wire helix — Slow wave Applicator
FIG. 2C — cylindrical cavity — Single Mode Cavity Applicator

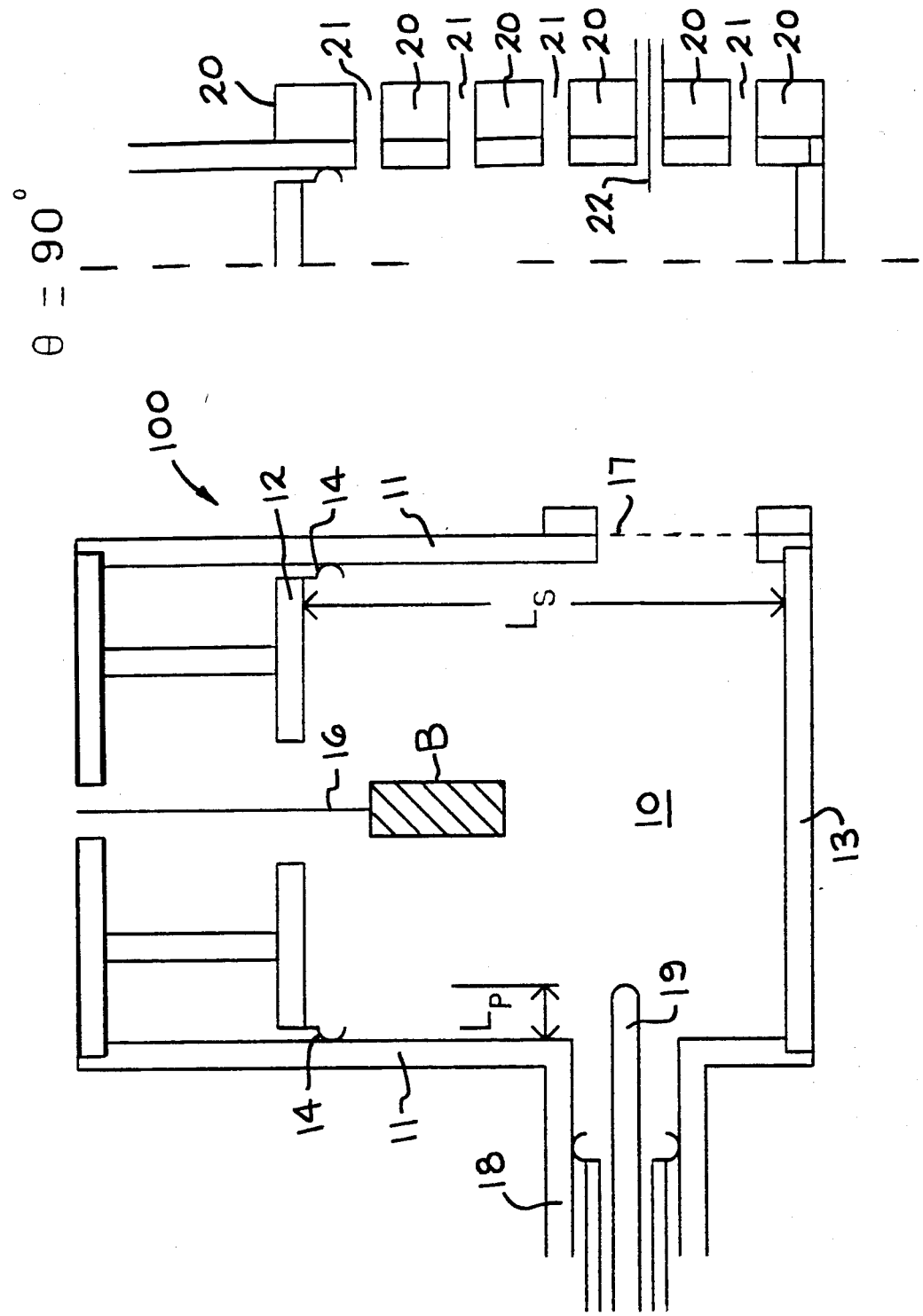

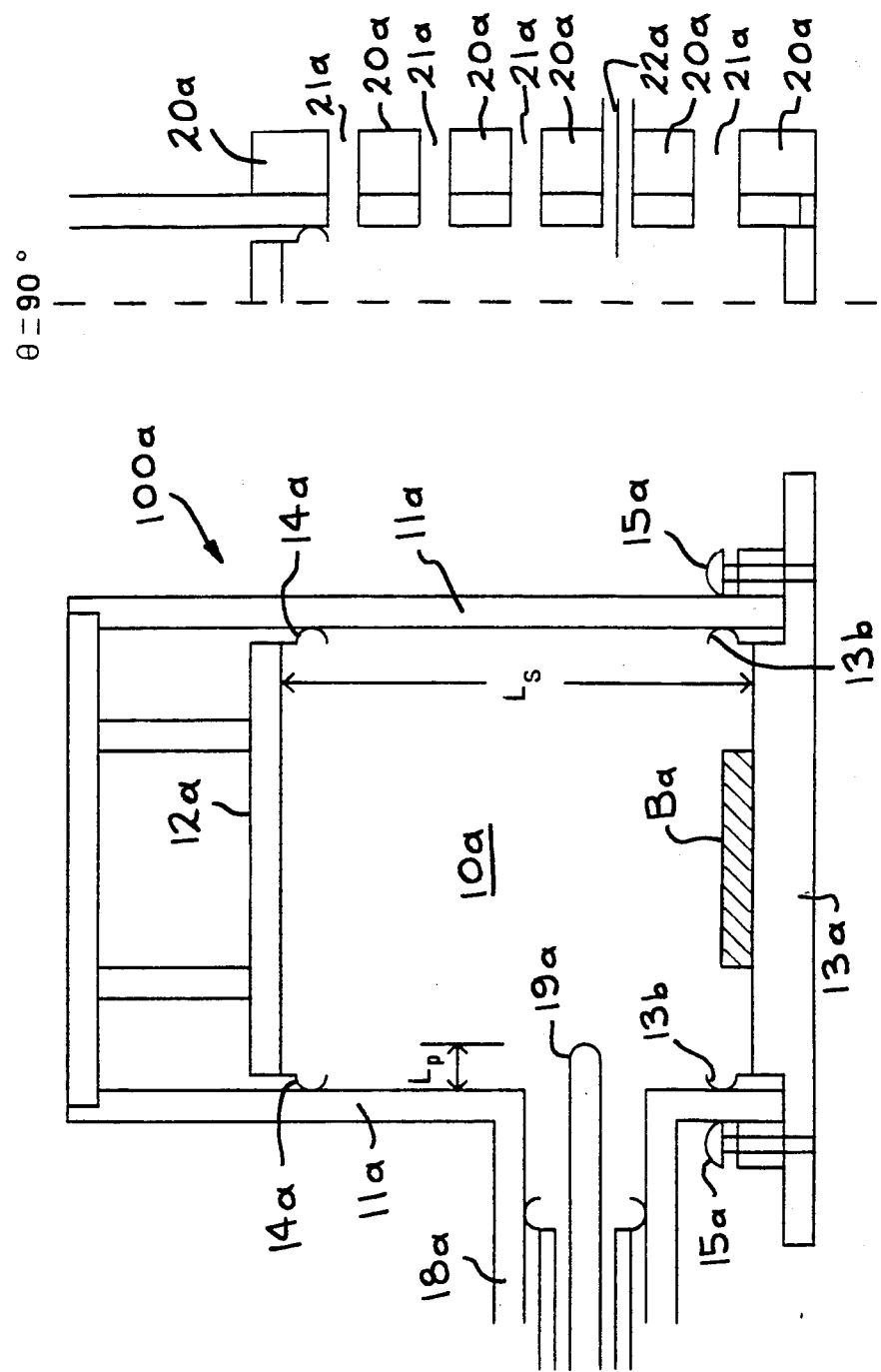

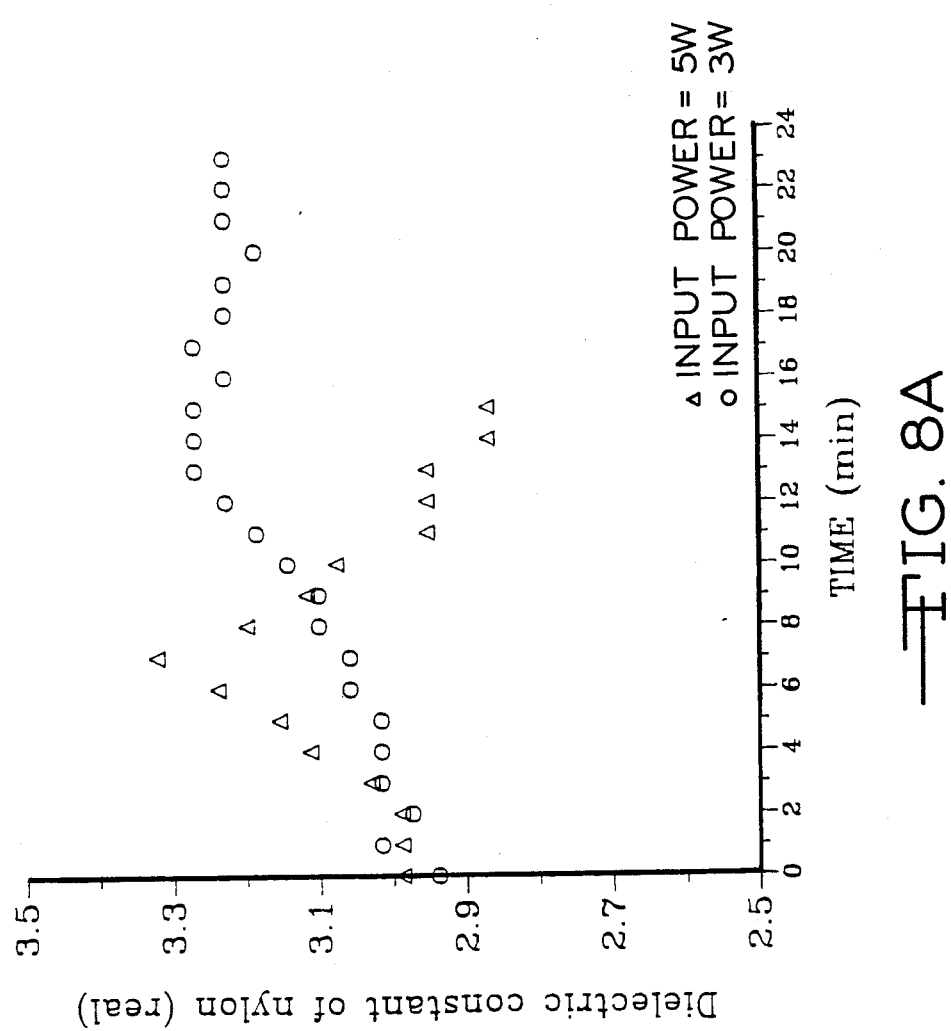

METHOD FOR TREATING A MATERIAL USING RADIOFREQUENCY WAVES

BACKGROUND OF THE INVENTION

1. Field of the Invention

The present invention relates to programmed single mode or controlled multimode radiofrequency wave heating of a material. In particular, the present invention relates to methods for determining a dielectric constant of a material as a function of time or for regulated, programmed heating of a material determined by changes of dielectric constant.

2. Prior Art

Many industrial and scientific applications of microwave (300 MHz-30 GHz) energy have emerged during the past 20 to 30 years of research and development. These applications include home and commercial heating and processing of foods, diathermy heating for cancer treatment, the production of plasma sources for plasma processing, plasma chemistry and fusion research, heat treatment of metal and semiconductor surfaces, and curing of polymer and composite materials. As a result of these many years of development, approaches to microwave applicator (or microwave coupler) design are well established. For example, most heating or processing applications make use of either non-resonant applicators in the form of single or multi-pass slotted waveguide, or multimode resonant cavities. However, modern microwave processing applications have imposed new requirements in applicator design for precision heating.

In response to increased interest in energy efficiency and interest in precision control of processing, recent trends in applicator design have centered on improving heating uniformity, increasing applicator coupling efficiency and on the development of electrical feedback control of microwave processing systems. In addition, if one is interested in understanding fundamental electromagnetic/material interactions it is desirable to be able to diagnose the material properties and the electromagnetic field strengths and patterns during the processing cycle. When considering efficiency and diagnosis as design criteria, the single mode (or controlled multimode) cavity applicator appears to have important advantages over multimode applicators.

I. APPLICATOR TYPES

The typical electromagnetic processing system and equivalent circuit operating at UHF and microwave frequencies is shown in FIGS. 1 and 1A respectively. It consists of several interconnected components: (1) an energy source, usually a constant frequency microwave oscillator, (2) transmission lines, i.e., usually a waveguide or coaxial cable, (3) the applicator and (4) the process material itself. An efficient processing system is designed for maximum power transfer between the microwave oscillator and the material loaded applicator. This occurs when the output admittance of the microwave oscillator, $Y_g$, and the input admittance of the material loaded applicator, $Y_{in}$, are equal to the transmission characteristic admittance $Y_o$.

Several typical conventional applicator types are shown in FIGS. 2 to 2C. As shown, they are non-resonant waveguide and slow wave couplers, and multimode and single mode cavity applicators. Examples of other applicators are specially designed antennas, radiators or traveling, slow wave shielded (E. D. M. El-Sayed and T. K. Abdel-Hamid, J. of Microwave Power, 16, 283 (1981)) or surface transmission lines. Most heating and materials processing applications make use of either non-resonant applicators in the form of single or multi-pass slotted waveguides or multimode resonant cavities (J. M. Osepehuk, IEEE Trans. Microwave Theory and Techniques, MTT-32, 1200 (1984); and D. A. Copson and R. V. Decareu, in Microwave Power Engineering, Vol. 2, edited by E. C. Okress (Academic Press, New York, 1968)). The most common applicator type is the overmoded or multimode cavity which is commonly called a "microwave oven". Less common, although not unknown in industrial applications are the waveguide, slow wave and traveling wave applicators. A few applications have employed resonant cavities operating in one or several TM modes (H. F. Huang, J. Microwave Power, 4, 289 (1969); and P. Bhartia, S. C. Kashyap and M. A. K. Hamid, J. Microwave Power, 6, 221 (1971)) which concentrate energy in regions where the material is located.

Applicator design is complex because efficient microwave energy transfer is a function of many variables which change as processing takes place. A number of these variables are material related and are represented as the load admittance, $Y_L$, in FIG. 1A. These variables can be better understood by examining several fundamental equations. For example, at any position r in a material $$\vec{D}(\vec{r}) = \hat{\epsilon}(\vec{r})\vec{E}(\vec{r}) \quad (1)$$

where
 $\vec{D}(\vec{r})$ = electric flux density
 $\vec{E}(\vec{r})$ = the electric field intensity
 $\hat{\epsilon}(\vec{r}) = \epsilon_o (\epsilon_r' - j\epsilon_r'')$ = the material complex dielectric constant at $\vec{r}$.

Assuming time harmonic excitation, the time average absorbed power density $<P>$ at r is given by $$<P> = \tfrac{1}{2}\omega\epsilon_o\epsilon_r''(\vec{r})|\vec{E_o}(\vec{r})|^2 \quad (2)$$

where $\omega$ = the excitation frequency and $|\vec{E_o}(\vec{r})|$ = the magnitude of the electric field in the material.

In general the material complex dielectric constant, $\epsilon$, is a function of excitation frequency, $\omega$, the electric field strength E (r), material type and density, material temperature $T_M$, and is also dependent on the time history of both the material temperature and the applied electric field, i.e., $$\epsilon = f(\omega, E, T_M, r). \quad (3)$$

In general the complex dielectric constant is a nonlinear function of E and $T_M$. As the material is heated the dielectric constant may exhibit hysteresis in temperature and electric field strength, and it also changes as chemical reactions occur. Thus during electromagnetic heating both the real and imaginary parts of the complex dielectric constant may change dramatically due to their dependency on temperature, chemical composition and electric field. Depending on the nature of the change in $\hat{\epsilon}$, this may result in thermal runaway, hot spots within the material and even in some cases reduced material heating. These material changes result in a nonlinear, variable equivalent material admittance, $Y_L$, and usually a mismatched, inefficient processing system.

Other factors that influence coupling are related to applicator and material geometry and the frequency or wavelength of the electromagnetic energy. Electromagnetic coupling depends on applicator size and geometry, material size and shape, the position of the material within the applicator, and even the relative sizes and shapes of the material and the applicator. In addition, both the applicator and material dimensions may change during heating which further complicates the efficient transfer of energy to the material load.

For efficient transfer of energy to the load some mechanism must be found to compensate for the varying load admittance in order to keep the material loaded applicator matched during processing. In addition, it is observed from equation (2) that if constant or controllable heating is desired then the magnitude of the electric field must be varied as a function of position to compensate for $\epsilon(r)$ variations. Thus, precision control of heating also implies varying the magnitude of $|E|$ with respect to position and time within the material loaded applicator.

The frequent use of multimode cavity and nonresonant applicators is a result of their low cost, simplicity of construction and their adaptability to many different heating loads. Multimode excitation reduces coupling sensitivities to the geometric and material variables discussed above. During excitation several modes may share heating, and as heating takes place and as material properties are changing new modes take over the heating process. Thus, the multimode applicators accept a wide range of material loads. However, the use of multimodes is at the expense of increased circuit losses (applicator and other coupling structure and transmission line losses), results in the oscillator usually not being adjusted to maximum power transfer, often results in nonuniform heating of the load material and is an electrically open loop processing system, i.e., it is a variable power, on-off processing system.

When considering more stringent design criteria, the single mode (or controlled multimode) cavity applicator appears to have important advantages over multimode applicators. These beneficial properties are discussed and demonstrated in this paper.

The disadvantages of a single mode applicator are two-fold. First, such an applicator is difficult to match and transfer energy into as the processing takes place since the load size and material properties vary during processing, causing the applicator resonant frequency and matching to vary from optimum. Secondly, it is commonly believed that the single mode applicator system must be designed for each application. This design process may involve a complicated theoretical analysis.

Single mode cavity applicator designs have been developed for the generation and maintenance of microwave discharges for plasmas (J. Asmussen, R. Mallavarpu, J. R. Hamann and H. C. Park, Proc. IEEE, 62, 109 (1974); J. Asmussen and J. Root, Appl. Phys. Letters, 44, 396 (1984); J. Asmussen and J. D. Root, U.S. Pat. No. 4,507,588, Mar. 26 (1985); J. Asmussen and D. Reinhard, U.S. Pat. No. 4,585,688, Apr. 29, 1986; J. Root and J. Asmussen, Rev. of Sci. Instrum. 56, 1511 (1985); S. Whitehair, J. Asmussen and S. Nakanishi, Appl. Phys. Lett. 44, 1014 (1984; M. Dahimene and J. Asmussen, J. Vac. Sci. Technol. B4, 126 (1986); and T. Roppel, D. K. Reinhard and J. Asmussen, J. Vac. Sci. Technol. B4, 195 (1986)).

It is not known to provide a controlled single or mulimode radiofrequency wave cavity to develop a pattern of tuning of the radiofrequency wave in the cavity for heating a material as a function of time or to determine the dielectric constant of the material as a function of time.

OBJECTS

It is therefore an object of the present invention to provide a method for determining the pattern of tuning of a single mode or controlled multimode radiofrequency wave in a cavity containing a material which is affected by the radiofrequency wave to change the dielectric constant of the material as a function of time. Further it is an object of the present invention to provide a method for determining the dielectric constant of the material as a function of time. These and other objects will become increasingly apparent by reference to the following description and the drawings.

IN THE DRAWINGS

FIGS. 2 to 2C show various types of known applicators.

FIGS. 3 and 3A is a front cross-sectional view showing a cylindrical cavity applicator for treating a rod of material. FIG. 3 is a full cross-section in the $\theta=0$ plane passing through the input probe 19. FIG. 3A is a partial cross section at $\theta=90°$ which displays microcoax inputs 22 for field strength detection. FIG. 4 is a cross-sectional view showing a cylindrical cavity applicator for processing a slab of material. FIG. 4 is a full cross section in the $\theta=0$ plane passing through the input probe 19a. FIG. 4A is a partial cross-section at $\theta=90°$ which displays microcoax inputs 22 for field strength detection.

Figure 1A:
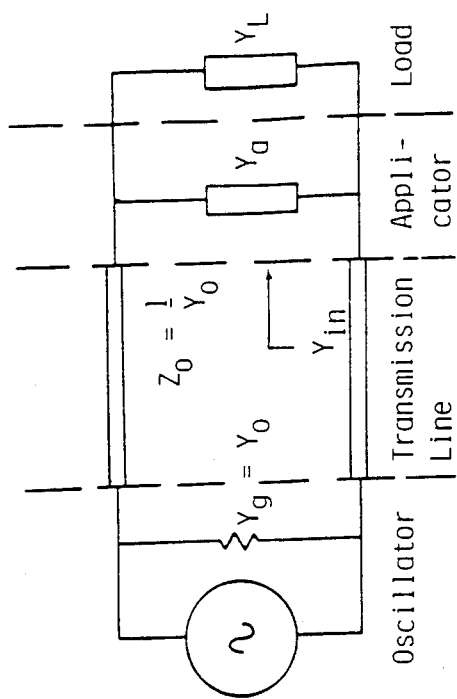
FIGS. 1 and 1A show generic electromagnetic processing systems. $Z_o$ is the characteristic impedance of the transmission line.
Figure 1:
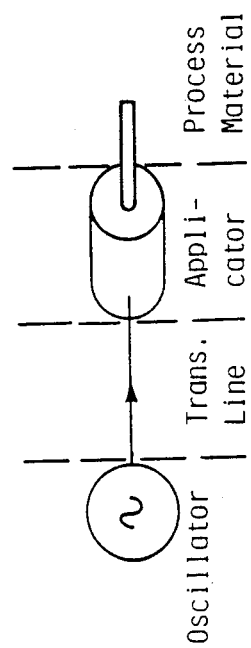
Figure 5:
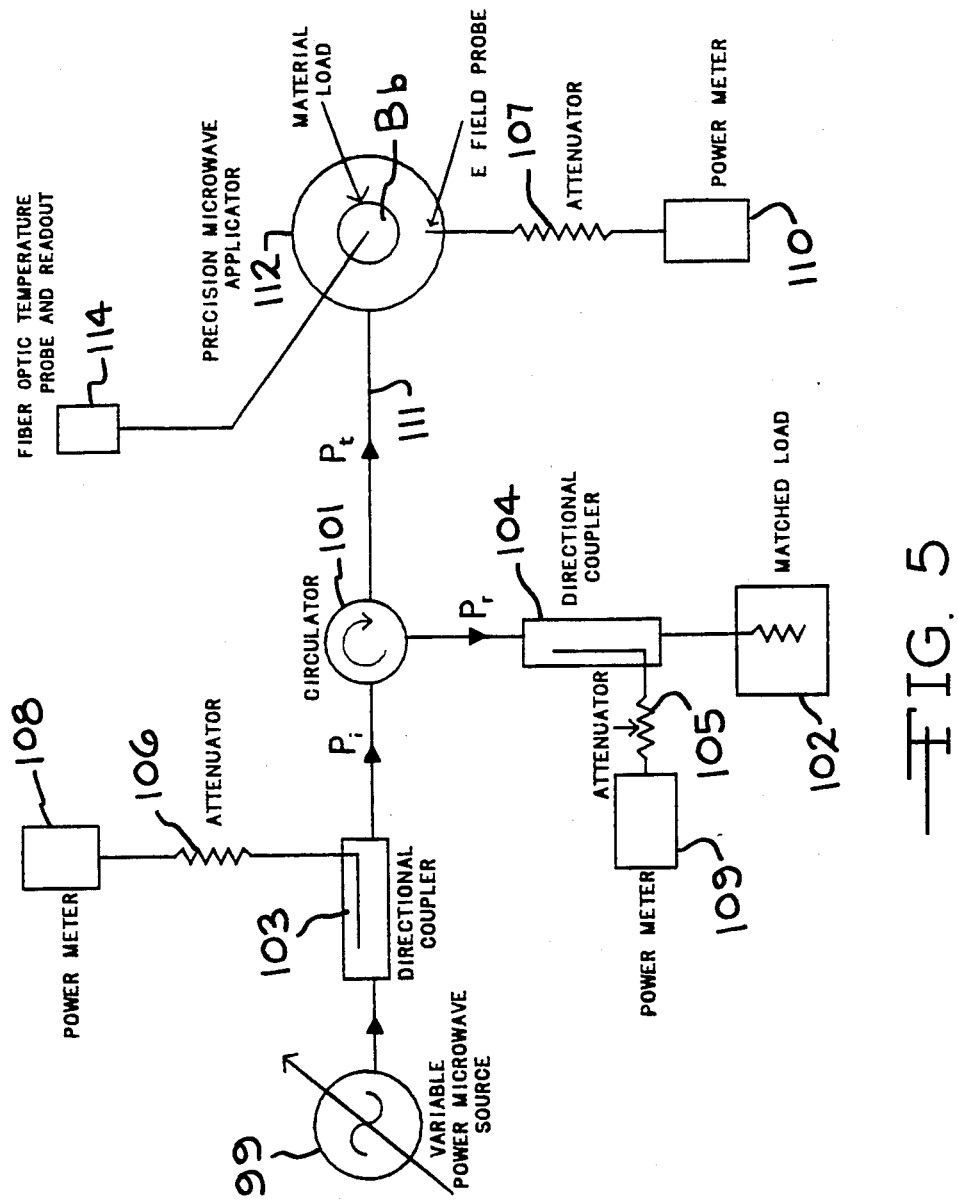

FIG. 5 is a schematic view showing a microwave system diagram of the present invention.

Figure 6:
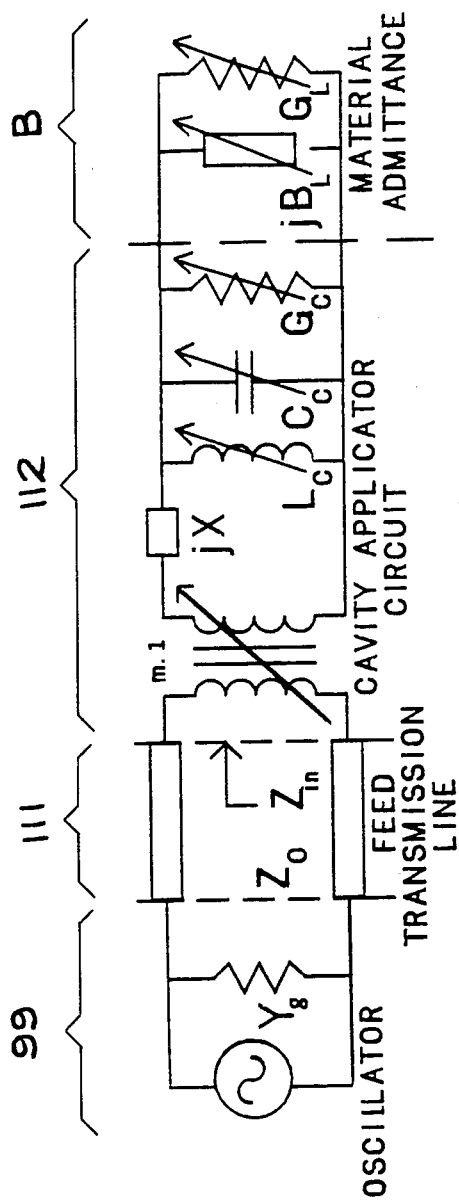

FIG. 6 is a schematic view showing an equivalent circuit of the single mode cavity applicator of FIGS. 3 to 5. The integrals describe the relationships between the equivalent lumped circuit elements and the electric and magnetic fields in a single mode cavity applicator. $\hat{\epsilon}$ is the material complex dielectric constant.

Figure 7:
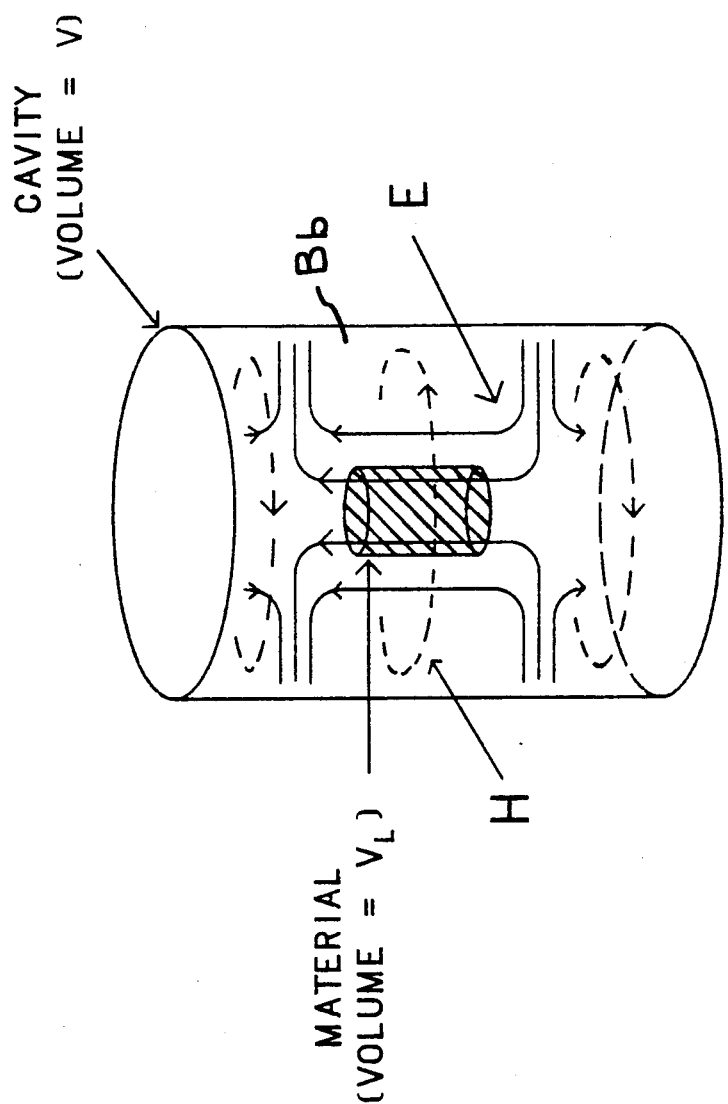

FIG. 7 is a schematic vew showing electric (E) and magnetic (H) field patterns for the single mode applicator with a rod Bb of material as in FIG. 3 excited in the $TM_{012}$ mode.

Figure 8B:
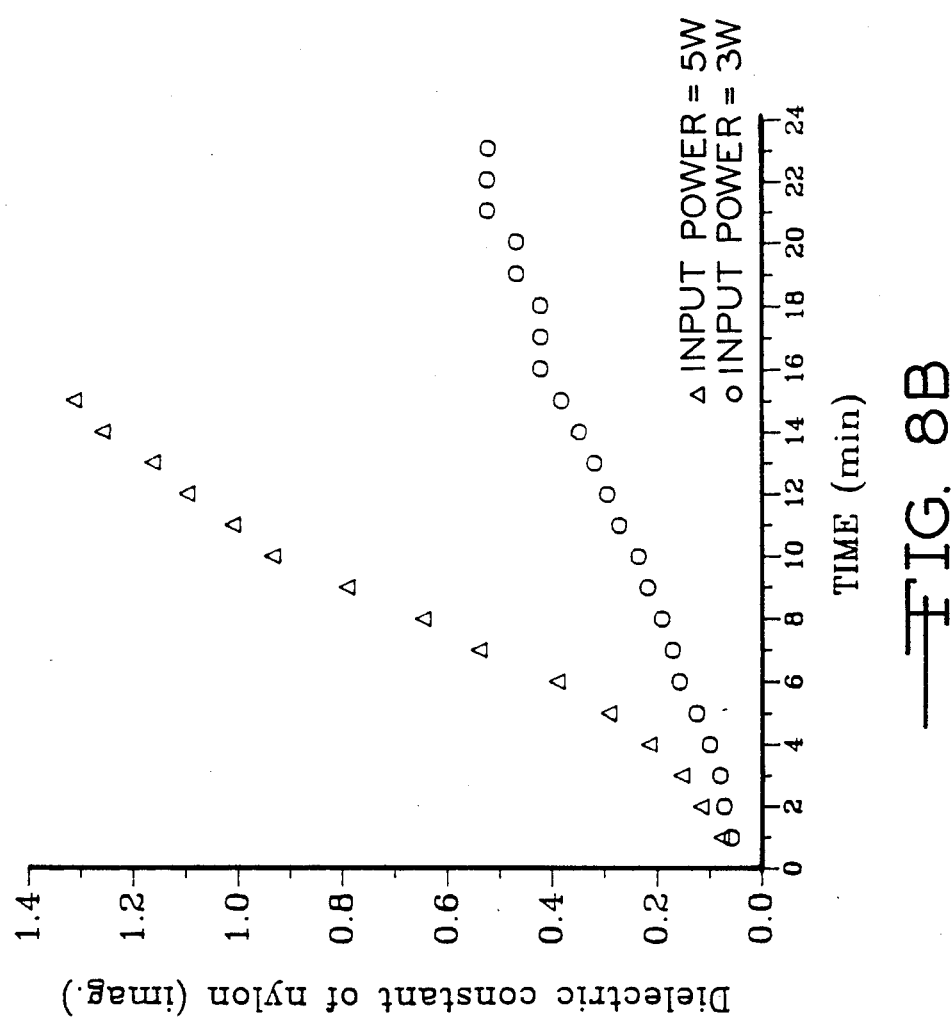

FIGS. 8A and 8B are graphs showing the variation of nylon 66 $\epsilon_r'$ (FIG. 8A) and $\epsilon_r''$ (FIG. 8B) vs time for two different input power levels.

Figure 9A:
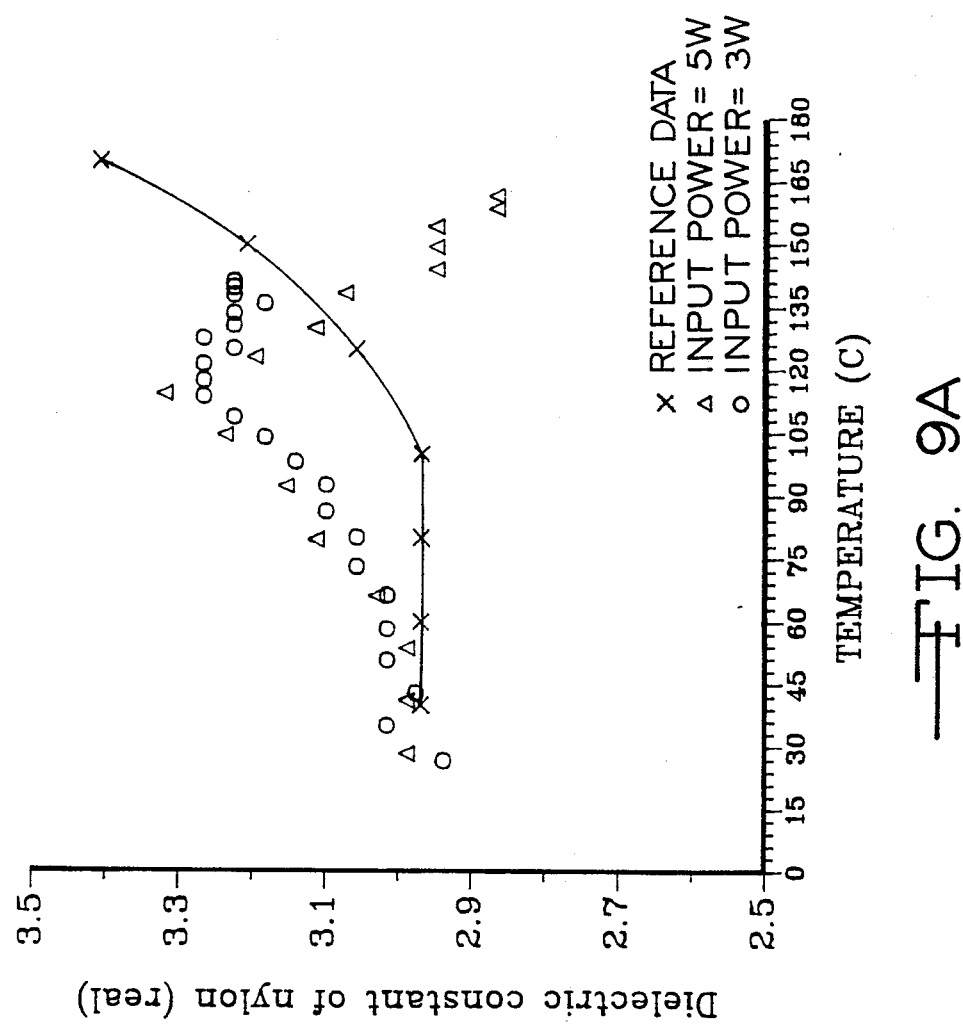
Figure 9B:
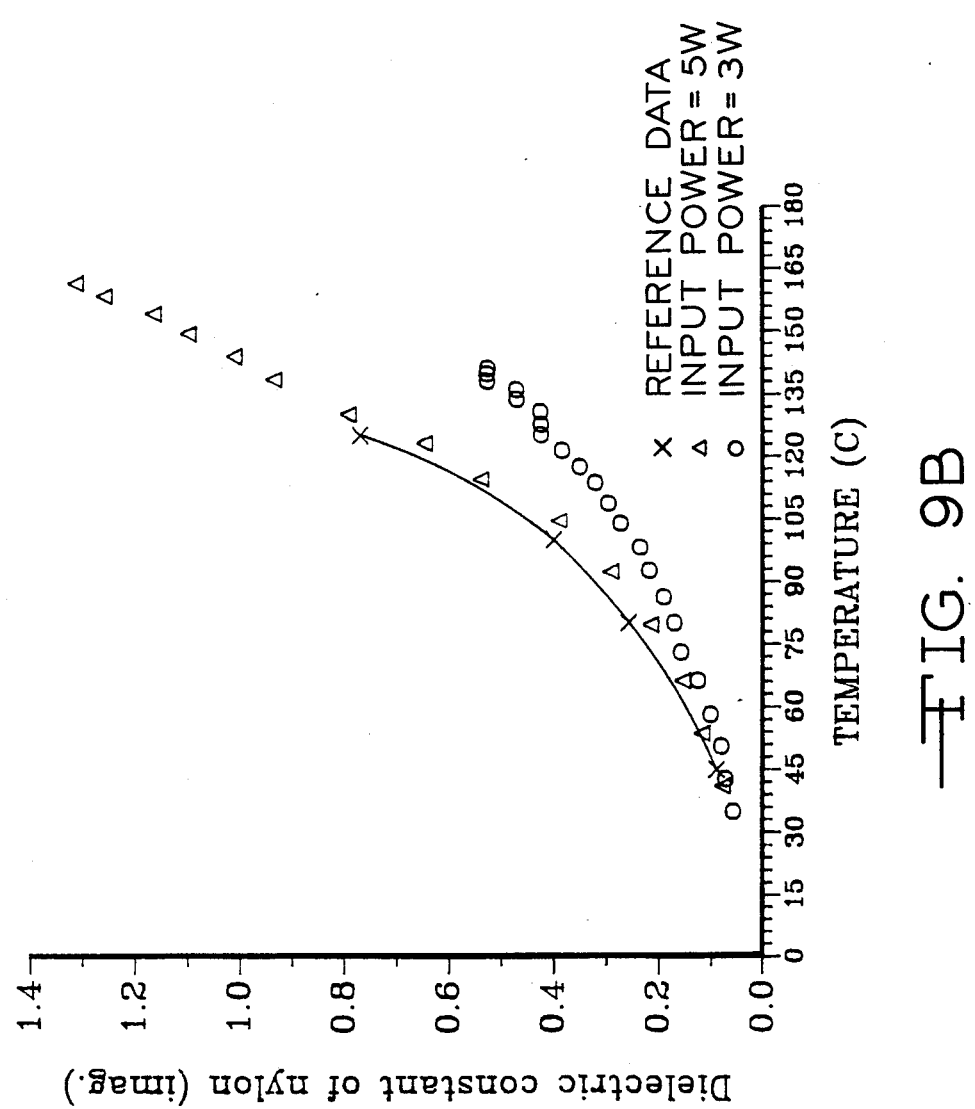

FIGS. 9A and 9B are graphs showing $\epsilon_r'$ and $\epsilon_r''$ variation vs. temperature for the nylon 66 data of FIGS. 8A and 8B. Open circle and triangles are experimental points. x represent data from reference (H. F. Haung, J. Microwave Power, 11, 305 (1976).

Figure 10:
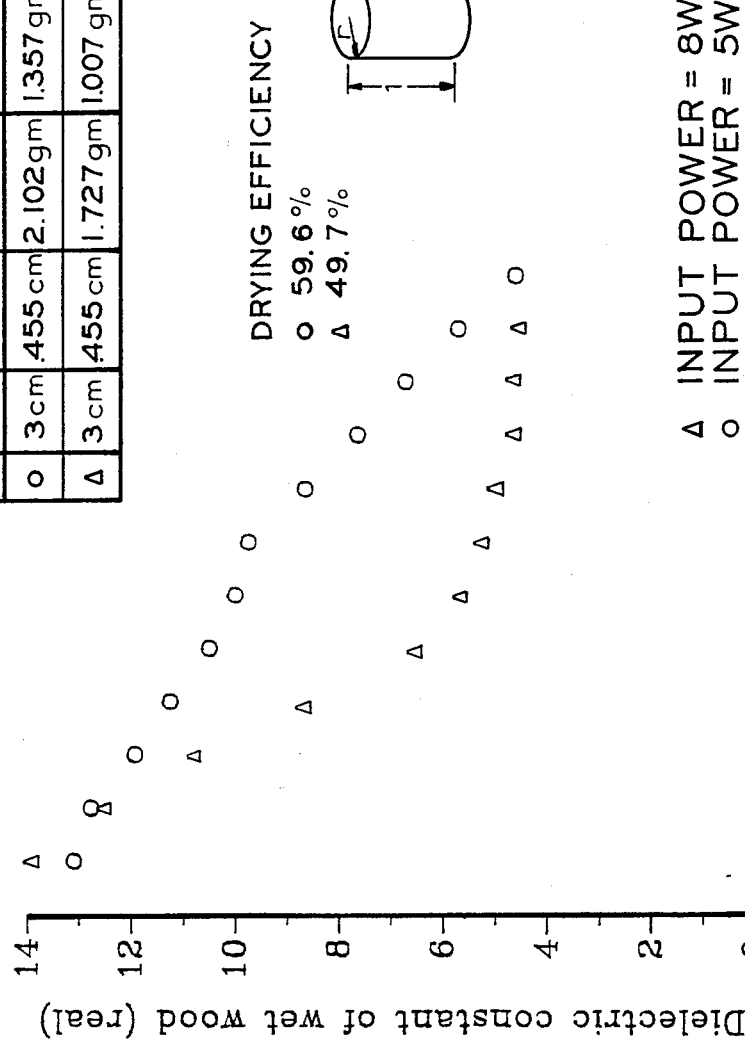

FIG. 10 is a graph showing the variation of $\epsilon_r'$ vs. time for wet wood cylinders.

Figure 11:
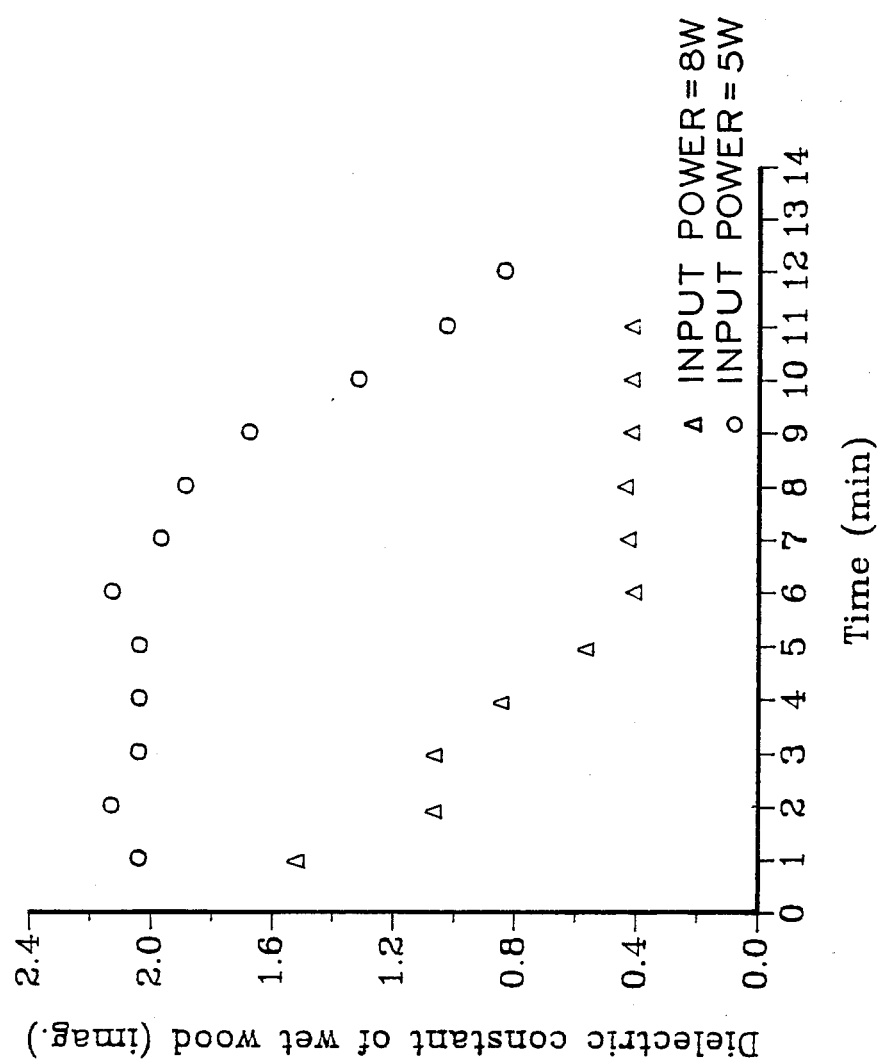

FIG. 11 is a graph showing the variation of $\epsilon_r''$ vs. time for wet wood cylinders.

Figure 12:
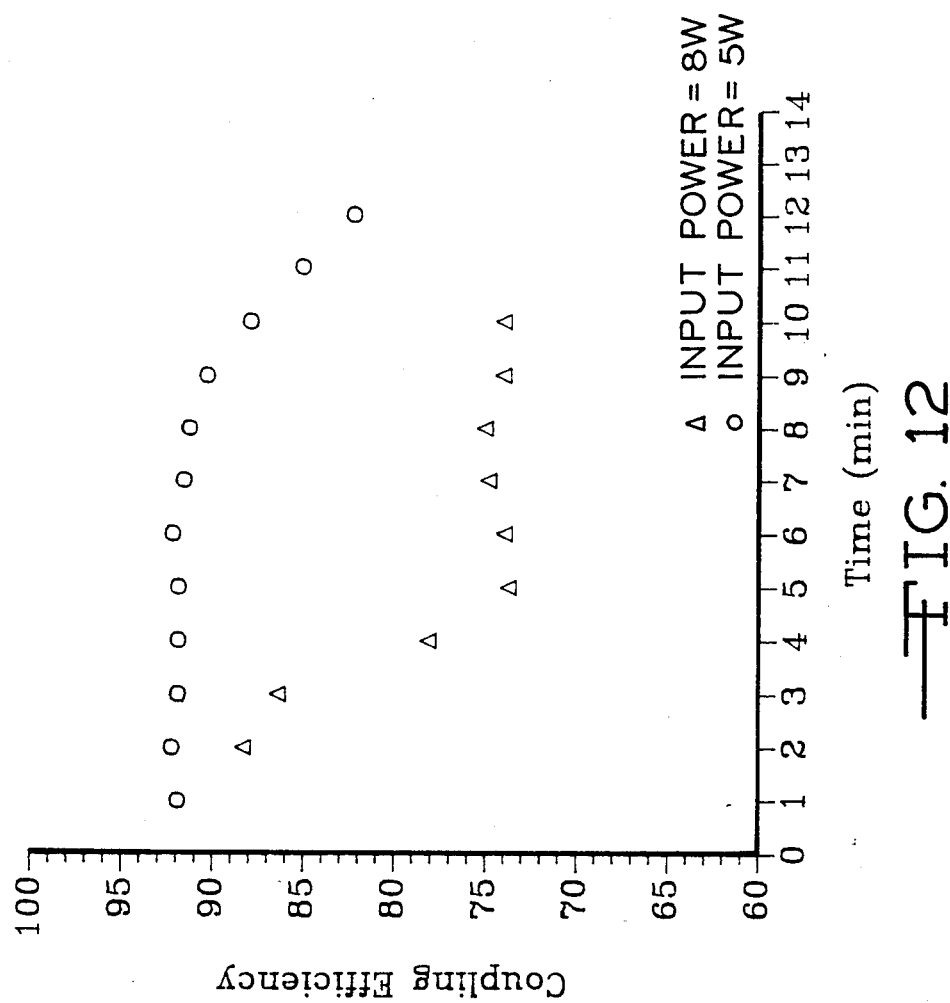

FIG. 12 is a graph showing the variation of coupling efficiency vs. time for wet wood.

Figure 13:
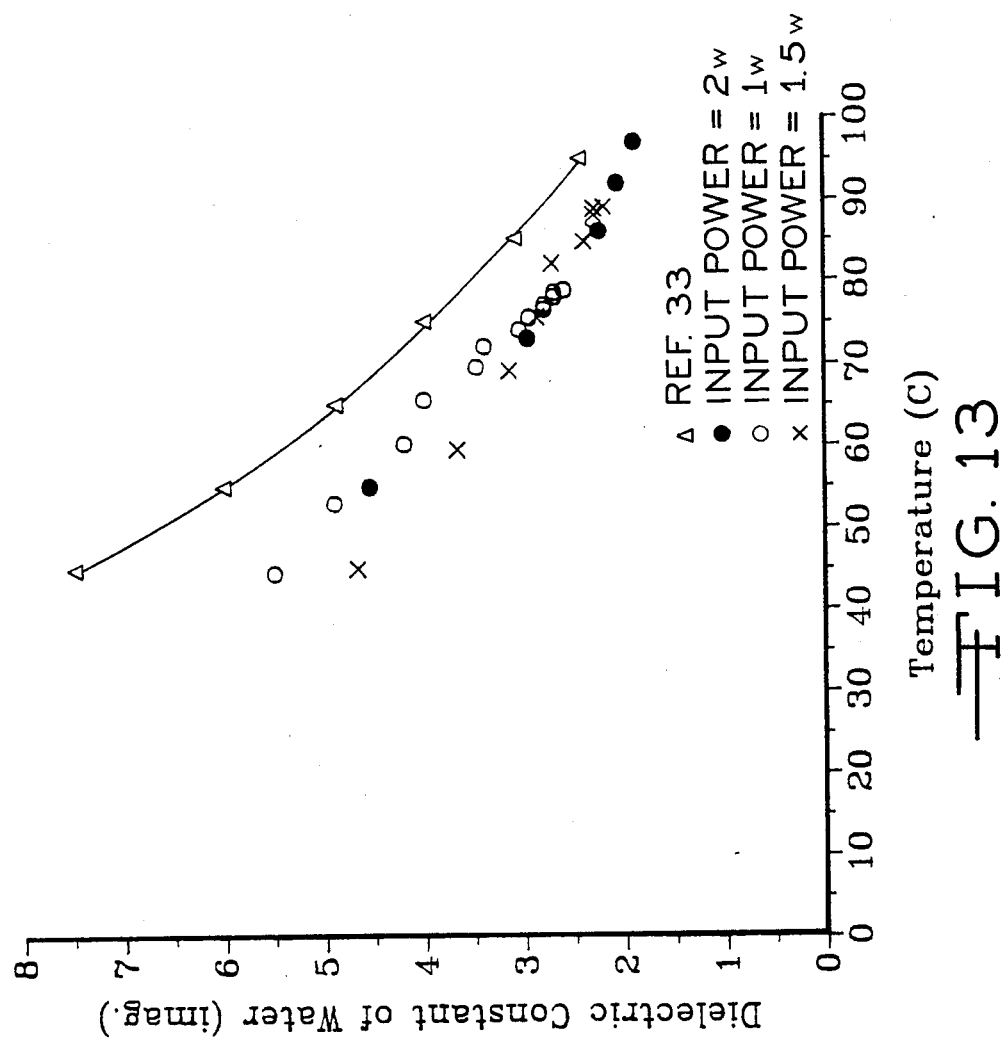

FIG. 13 is a graph showing the variation of $\epsilon_r''$ for enclosed quartz cylinders of water. $\Delta$ represents published data from A. R. Von Hippel, Dielectric Materials and Applications (MIT Press, Cambridge, MA. 1954), pp. 361).

Figure 14:
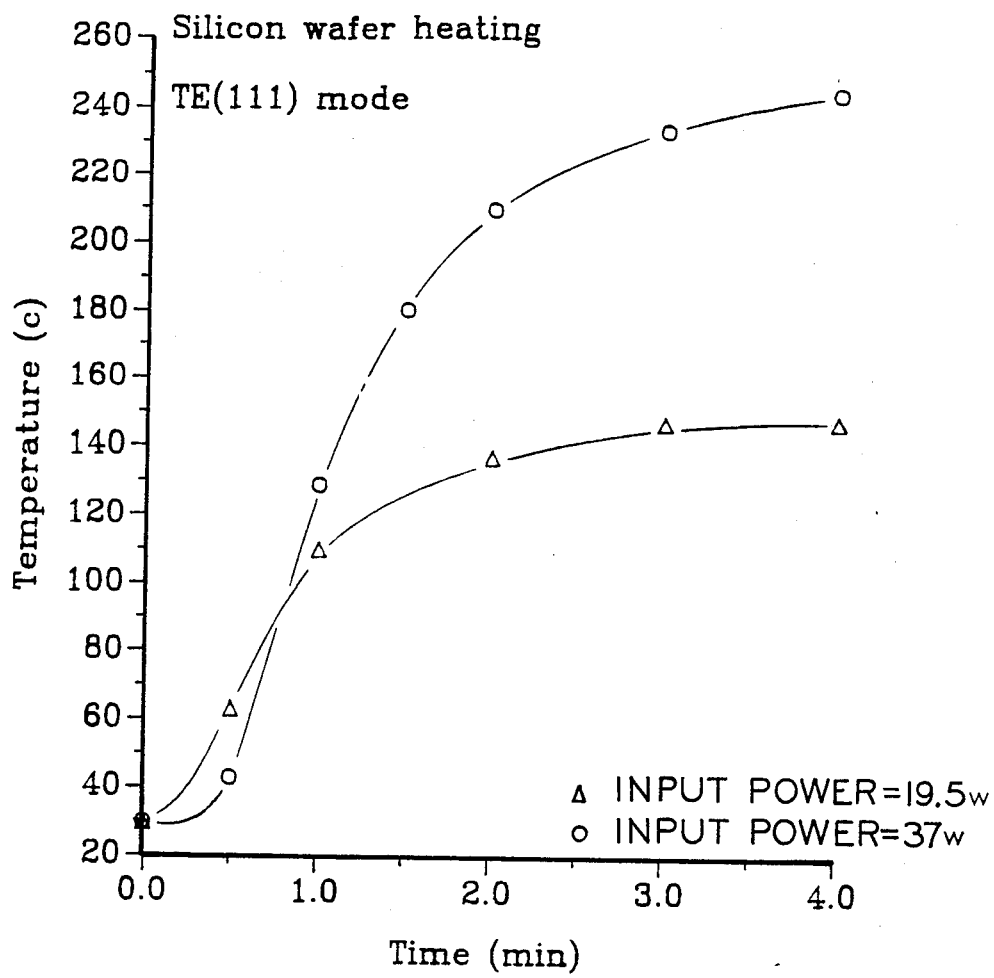

FIG. 14 is a graph showing temperature versus time for three inch silicon wafer heating in the single mode applicator.

GENERAL DESCRIPTION

The present invention relates to a method of heating of a material which comprises: providing a radiofrequency wave generating apparatus including a metallic radiofrequency wave cavity which is excited in one or more of its TE or TM modes of resonance in the cavity around an axis of the cavity including moveable plate means in the cavity mounted perpendicular to the axis in the cavity, moveable probe means connected to and extending inside the cavity for coupling the radiofrequency wave to the cavity and control means for moving the probe and plate in order to select and control the mode of the radiofrequency wave in the cavity; heating a first material with an initial dielectric constant positioned in the cavity with the radiofrequency wave and maintaining the mode of the radiofrequency wave during the heating as a result of tuning by moving the probe or the plate or by varying the frequency or power of a source of the radiofrequency wave as the dielectric constant of the material changes during the heating wherein the mode in the cavity is maintained using measured incident and reflected power such that the reflected power from the cavity is continuously tuned to approximately zero in the cavity; determining a pattern of the tuning during the heating of the first material as a function of time in the cavity; and repeating the pattern of the tuning of the power on an identical second material identically positioned in the cavity. It is preferred to determine an optimal pattern of heating of the first material which is then used with the second and following materials.

Further the present invention relates to a method of heating of a material which comprises: providing a radiofrequency wave generating apparatus including a metallic radiofrequency wave cavity which is excited in one of its TE or TM modes of resonance in the cavity around an axis of the cavity including moveable plate means in the cavity mounted perpendicular to the axis in the cavity, moveable probe means connected to and extending inside the cavity for coupling the radiofrequency wave to the cavity and control means for moving the probe and plate in order to select and control the mode of the radiofrequency wave in the cavity; heating a material with an initial dielectric constant positioned in the cavity with the radiofrequency wave and maintaining the mode of the radiofrequency wave during the heating by moving the probe or the plate or by varying the frequency or power of a source of the radiofrequency wave as the dielectric constant of the material changes during the heating, wherein the mode in the cavity is maintained during the heating using incident and reflected power initially as a function of time during the heating of the material in the cavity such that the reflected power from the cavity is continuously tuned to approximately zero and wherein the field strength and the incident power and reflected power are measured initially with an empty cavity and during the heating at one position in the cavity; and calculating the dielectric constants of the material as a function of time in the cavity using the measurements taken at preselected times during heating of field strength, incident and reflected power and the probe and the plate position with the material in the cavity and with the empty cavity.

In the following description, the method using a single mode microwave cavity applicator is set forth. These microwave applicators utilize an internally tuned, single-mode (or selective multimode) cylindrical cavity applicator to focus and match microwave energy into cylindrical rod, disk or slab shaped material loads. The combination of mode focus control and variable, internal cavity matching allows the efficient coupling of microwave energy into a wide range of material loads. The experimental operation of these applicators has been demonstrated for low loss to lossy materials, which include nylon, water and semiconducting silicon wafers. Overall microwave coupling efficiencies of 70–95% were measured and experiments demonstrated the ability to precisely control material heating. On-line process diagnosis using the exciting mode was achieved and was experimentally demonstrated. When using these cavity applicators many system variables such as tuning, cavity electric field strength, input power control, etc. are available as potential process system feedback signals for automated intelligent processing. These applicators can be used to study the fundamentals of electromagnetic interactions of many materials. These applications include the electromagnetic heating of foods, semiconducting and biological materials, and the heating and curing of epoxy and composite materials.

II. DETAILED APPLICATOR DESCRIPTION

The two prototype cylindrical cavity applicators are shown in FIGS. 3 and 4. The resonant cavity 10 or 10a is formed by the 17.8 cm inside diameter cylindrical brass tube 11 or 11a and the transverse brass shorting plates (or shorts) 12 and 13 or 12a and 13a. One of the plates 12 or 12a is adjustable to provide a variable cavity length of 6 to 16 cm. The other shorting plate 13 or 13a is fixed in position during operation and is either soldered to the brass tube 11 as shown in FIG. 3 or is removable from tube 11a as shown in FIG. 4. Silver plated finger stock 13b, 14 or 14a provided the required good electrical contact on the adjustable short 12 or 12a and the removable short 13a of FIG. 4. Four threaded bolts 15a (two shown) hold the fixed short (13a) in place on the tube 11a during cavity 10 or 10a excitation.

Cavity length variation allows the individual selection and matching of different cavity modes. Examples of empty cavity modes are $TE_{111}$, $TM_{012}$, $TE_{011}$ and $TM_{111}$ (degenerate modes), and $TE_{311}$. Once the cavity is loaded with a material B or $B_a$, then these modes are modified (J. Asmussen, R. Mallavarpu, J. R. Hamann; and H. C. Park, Proc. IEEE, 62, 109 (1974)) and become, in general, hybrid modes (R. F. Harrington, Time-harmonic Electromagnetic Fields, (McGraw-Hill, New York, 1961) and, depending on the material B or $B_a$ properties and placement, new cavity modes may be introduced.

The process material B or $B_a$ is either suspended in the center of the cavity by a cotton thread 16 as shown in FIG. 3 or rests on the cavity fixed short or plate 13a as shown in FIG. 4, or can be placed on a thin teflon support (not shown). The material can be viewed through a copper screened window 17. Input microwave power is fed into the coaxial input port 18 or 18a and is coupled into the cavity via the adjustable coaxial probe 19 or 19a. Adjustment of plate 12 or 12a length, $L_s$, and coupling probe 19 and 19a position, $L_p$, are made by manual or automatic movement of the probe 19 or 19a or plate 12 or 12a. Short 12 or 12a and probe 19 or 19a positions were measured to within 0.1 mm by the micrometer indicators (not shown).

A rectangular brass piece 20 was soldered onto the outside of the cylindrical tube 11 parallel to the axis of the cavity as shown in FIGS. 3A and 4A. Several 12 mm, diagnostic holes 21 or 21a were drilled through this piece and the cavity wall of the tube 11 or 11a at known axial locations and small electrical E field probes 22 or 22a made from 2 mm o.d. microcoax were inserted into the diagnostic holes 21 or 21a. When calibrated, these probes 22 or 22a measured the excited cavity radial electric field strength, $|E_r|$, near the cylindrical wall of the tube 11 or 11a.

EXPERIMENTAL SYSTEM

The experimental heating and processing measurements were performed with a variable power, CW, microwave system. A circuit diagram of this system is shown in FIG. 5. It consists of a (1) 2.45 GHz, CW variable power source 99, (2) circulator 101 and matched dummy load 102, (3) coaxial directional couplers 103 and 104, attenuators 105, 106 and power meters 108 and 109 that measure incident power $P_i$ and reflected power $P_r$, (4) a coaxial input coupling system 111 and (5) the microwave applicator 112 and material load $B_b$.

The microwave power coupled into the applicator 112 is then given by $P_t = P_i - P_r$. Two different microwave power sources 99 were employed in the experiments reported here. A sweep generator operated CW at 2.45 GHz was connected to an amplifier such as a traveling wave tube (TWT) and provided 0–15 W of variable incident power. Experiments with higher input powers used a variable power, 15–100 W, magnetron supply. If on-line material diagnostic measurements were desired then input frequency was held constant to less than 0.1 MHz during heating. Otherwise, conventional microwave power sources were used.

FIG. 6 shows the equivalent circuit. The power delivered to the applicator, $P_t$, divides itself between the power delivered to the conducting cavity walls of tube 11 or 11a of applicator 100 or 100a, and the power delivered to the material load B, $B_a$ or $B_b$; i.e. $P_t = P_b + P_a$ when $P_b$ is the power delivered to the applicator walls and $P_a$ is the power delivered to the material load. As shown in FIG. 6 and discussed in more detail hereinafter these two quantities can be related to the cavity 10 or 10a fields, the intrinsic resistance, R, of the inside walls of the tube 11 or 11a forming the cavity 10 or 10a, material, volume $V_L$ and the complex dielectric constant of the material B, $B_a$ or $B_b$ load. The exact division of the power between the walls of the tube 11 or 11a and the material load B, $B_a$ or $B_b$ depends on the relative lossyness of the material B, $B_a$ or $B_b$ vs the lossyness of the cavity walls of the tube 11 or 11a.

Also shown in FIGS. 3A, 4A and 5 is a coaxial E field probe 22 or 22a is inserted into the cavity 10 or 10a and is connected through an attenuator 107 to a power meter 110. This probe 22 or 22a measures the square of the normal component of electric field on the conducting surface of the tube 11 or 11a. A fiber optic temperature measuring probe 114 is inserted into the cavity 10 or 10a and is mounted on or in the material B, Ba or Bb for temperature measurement.

COUPLING, MATCHING AND CONTROL WITH SINGLE MODE CAVITY APPLICATORS

An important feature of the cylindrical cavity applicators 100 or 100a is their ability to focus and match the incident microwave energy into the process material B, Ba or Bb. This is accomplished with single mode excitation and "internal cavity" matching. By proper choice and excitation of a single electromagnetic mode in the cavity 10 or 10a, microwave energy can be controlled and focused into the process material B, Ba or Bb. The matching is labeled "internal cavity" since all tuning adjustments take place inside the cavity 10 or 10a. This method of electromagnetic energy coupling and matching is similar to that employed in recently developed microwave ion sources (J. Asmussen and J. Root, Appl. Phys. Letters, 44, 396 (1984); J. Asmussen and J. Root, U.S. Pat. No. 4,507,588, Mar. 26 (1985); J. Asmussen and D. Reinhard, U.S. Pat. No. 4,585,688, Apr. 29 (1986); J. Root and J. Asmussen, Rev. of Sci. Instrum. 56, 1511 91985); M. Dahimene and J. Asmussen, J. Vac Sci. Technol. B4, 126 (1986). The differences with this application are associated with the controlled, variable coupling to a solid material B, Ba or Bb in the cavity 10 or 10a.

The input impedance of a microwave cavity 10 or 10a is given by $$Z_{in} = \frac{P_t + j2(W_m - W_e)}{\frac{1}{2}|I_o|^2} = R_{in} + jX_{in} \qquad (4)$$

where $P_t$ is the total power coupled into the cavity 10 or 10a (which includes losses in the metal walls of the tube 11 or 11a and plates 12, 12a, 13 and 13a as well as the power delivered to the material B, Ba or Bb). $W_m$ and $W_e$ are, respectively, the time-averaged magnetic and electric energy stored in the cavity 10 or 10a fields and $/I_o/$ is the total input current on the coupling probe 19 or 19a. $R_{in}$ and $jX_{in}$ are the cavity 10 or 10a input resistance and reactance and represent the complex load impedance as seen by the feed transmission line 111 which is the input coupling system.

At least two independent adjustments are required to match this material B, Ba or Bb load to transmission line 111. One adjustment must cancel the load reactance while the other must adjust the load resistance to be equal to the characteristic impedance of the feed transmission system. In the cavity applicator 10 or 10a, referring again to FIGS. 3 and 4, the continuously variable probe 19 or 19a and cavity end plate 12 or 12a tuning provide these two required variations, and together with single mode excitation are able to cancel the material B, Ba or Bb loaded cavity reactance and adjust the material B, Ba or Bb loaded cavity 10 or 10a input resistance to be equal to the characteristic impedance of the feed transmission line 111 which is the input coupling system.

Internal cavity 10 or 10a matching can best be understood with the aid of the equivalent circuit shown in FIG. 6. The figure displays a standard circuit representation for a cavity 10 or 10a which is connected to a feed waveguide or transmission line 111 and is excited in the vicinity of a single mode resonance (S. Ramo, J. R. Whinnery and T. VanDuzer, Fields and Waves in Communication Electronics (Wiley, New York, 1967), pp. 565). $G_c$, $L_c$ and $C_c$ represent the conductance, inductance and capacitance, respectively, of the excited mode near resonance and the jX represents the reactive effect of the evanescent modes far from resonance. The relationships between the cavity 10 or 10a fields and these equivalent lumped circuit elements is also shown in FIG. 6. In an empty cavity 10 or 10a $\epsilon_r'=1$ and $V_L$ and $\epsilon_r''=0$ throughout the interior cavity 10 or 10a volume. Thus, integrations for $C_c$ and $L_c$ are over the entire cavity 10 or 10a volume V. At resonance, the capacitive and inductive susceptance cancel resulting in a purely conductive input impedance. In FIG. 6, the coupling probe 19 or 19a is represented as a lumped reactance jX and the ideal transformer of turns ratio m:1. Both circuit elements and the transformer m:1 are drawn with arrows to indicate their variability during the tuning process.

When the material B, Ba or Bb load is placed in the empty cavity 10 or 10a each electromagnetic resonance is shifted down in frequency and Q is lowered. The presence of the material B, Ba or Bb load then changes $L_c$, $G_c$ and $C_c$ and adds an additional material B, Ba or Bb conductance $G_L$ and susceptance, $jB_L$, to the circuit. As is shown in the equations in FIG. 6 these additional circuit elements are functions of the material B, Ba or Bb load placement, volume, shape, and material B, Ba or Bb properties. The electromagnetic resonance shift is then a function of these properties.

The material B, Ba or Bb load is irradiated with microwave energy by first adjusting the probe 19 or 19a and cavity 10 or 10a length positions with plate 12 or 12a to excite a specific loaded cavity 10 or 10a resonance and to match the cavity 10 or 10a applicator to the input transmission system. The specific electromagnetic mode chosen depends on the shape and location of the material B, Ba or Bb load. For example, if the material B, Ba or Bb is cylindrical and located in the center of the cavity as shown in FIG. 7 in perspective view then the loaded cavity 10 or 10a $TM_{012}$ mode with its high electric field along the cavity 10 or 10a axis is a logical processing mode as also shown in FIG. 3. If the material B, Ba or Bb is a thin slab located in the bottom of the cavity 10 or 10a as shown in FIG. 4 then either a TE mode or TM mode appear to be good choices.

Once adjusted for a match in the prespecified mode, microwave power is then applied, absorbed into the cavity 10 or 10a without reflection, and heating of the material B, Ba or Bb then begins. This heating then changes the material B, Ba or Bb properties. In particular, $\epsilon$ will take on new values resulting in a shift in the cavity 10 or 10a resonance and a change in applicator tube 11 or 11a input impedance. Thus, during processing the applicator 100 or 100a length by means of plate 12 or 12a, $L_s$, and coupling probe 19 or 19a penetratin, $L_p$, are varied iteratively until reflected power is reduced to zero, i.e., during processing the applicator is matched as material B, Ba or Bb properties change. Typical tuning distances are on the order of several millimeters requiring precise measurement. The tuning process can be quickly performed either manually or with small motors (not shown) attached to the probe 19 or 19a and plate 12 or 12a. This tuning can also be utilized as a simple input power control technique.

The ability to be mechanically tuned serves other practical functions. In addition to mode selection and matching it allows different material B, Ba or Bb loads to be matched to a given constant frequency power source. Variations in cavity 10 or 10a resonant frequency caused by (1) cavity 10 or 10a expansion or contraction due to ambient temperature changes (C. G. Montgomery, Technique of Microwave Measurements, Vol. 1, (Dover Pub., New York, N.Y. 1966), pp. 384) and (2) relative humidity changes in the air (C. G. Montgomery, Technique of Microwave Measurements, Vol. 1, (Dover Pub., New York, N.Y. 1966), pp. 384) inside the cavity 10 or 10a can also be cancelled. Frequency drifts caused by variations in output power and heating of the power oscillator 99 can be compensated for by mechanical tuning. Finally, it allows the applicators 100 or 100a to be used with power oscillators 99 which oscillate at different frequencies.

BASIC EQUATIONS AND MEASUREMENTS TECHNIQUES

In the experiments reported here, several material B, Ba or Bb samples were excited and heated with electromagnetic energy. The material volumes were intentionally kept small, and simple shapes, such as disks and cylinders, were chosen in order to be able to combine experiments with electromagnetic perturbation theory (R. F. Harrington, Time Harmonic Electromagnetic Fields, (McGraw-Hill, New York, 1961); C. G. Montgomery, Technique of Microwave Measurements, Vol. 1, (Dover Pub., New York, N.Y., pp. 384 (1966)). Larger material volumes require a more exact, complete electromagnetic analysis of the material loaded cavity.

A number of measurements were performed to evaluate the cavity applicator performance. Among these were the measurement of material complex dielectric constant, material loaded cavity quality factor, and applicator coupling efficiency during electromagnetic heating. The techniques of measurement of each of these quantities are described below.

The principal mode used to demonstrate the heating and simultaneous diagnosis was the $TM_{012}$ mode which is shown in FIG. 7, exciting a small cylindrical sample. Using conventional pertubation theory of such a material loaded cavity 10 or 10a it can be shown that (R. F. Harrington, Time-harmonic Electromagnetic Fields, (McGraw-Hill, New York, (1961))

$$\frac{\omega - \omega_o}{\omega_o} \simeq \frac{(1 - \epsilon_r')}{2} \left( \frac{\int_{V_L} |E_{zo}|^2 dv}{\int_V |E_o|^2 dv} \right) \tag{5}$$

and $$\frac{1}{Q_u} - \frac{1}{Q_o} \simeq \epsilon_r'' \left( \frac{\int_{V_L} |E_{zo}|^2 dv}{\int_V |E_o|^2 dv} \right) \tag{6}$$

where
 $\omega_o$=empty cavity resonant frequency
 $\omega$=material loaded cavity resonant frequency and cavity processing frequency
 $Q_o$=empty cavity quality factor
 $Q_u$=material loaded cavity quality factor
 $\epsilon = \epsilon_o(\epsilon_r' - j\epsilon_r'')$=the real and imaginary parts of the material complex dielectric constant.
 $E_{zo}$=empty cavity $TM_{012}$ mode axially directed electric field $E_o$ = magnitude of the empty cavity electric field strength
$V_L$ = material volume
$V$ = empty cavity volume The empty cavity 10 or 10a electric field strengths are well known for the $TM_{012}$ mode and thus, for a given material B, Ba or Bb sample with radius r, and length l, the integrals of equations (5) and (6) can be determined. Thus, if $Q_u$, $Q_o$, $\omega$ and $\omega_o$ are measured, then $\epsilon_r'$ and $\epsilon_r''$ can be calculated from equations (5) and (6).

Conventional complex dielectric constant measurement techniques usually employ a low power, swept frequency signal to measure quality factor and resonant frequency with and without a material B, Ba or Bb load (C. G. Montgomery, Technique of Microwave Measurements, Vol. 1, (Dover Pub., New York, N.Y. pp. 384 (1966); and S. Li, C. Akyel and R. G. Bosisio, IEEE Trans. Microwave Theory, MTT-29, 1041 (1981)). If the material B, Ba or Bb is simultaneously being heated or processed with microwave energy, which has a field intensity of one hundred to one thousand times that of the lower power diagnostic signal, then the leakage of the high power heating energy into the diagnostic circuits often impairs measurements. Here, a different technique is employed. The high input power exciting fields of the $TM_{012}$ mode are used to both heat and diagnose the material as processing occurs.

The measurement technique employed has been described in detail earlier (J. Rogers, Ph.D. Thesis, 1982, Michigan State University) and, thus, is only summarized briefly here. An important assumption of the measurement is that the presence of the material B, Ba or Bb load does not significantly alter the spatial distribution of the cavity wall currents from those of the empty cavity 10 or 10a $TM_{012}$ mode. Evidence supporting this assumption is that only very small experimental changes in resonant length are required to match the material cavity 10a or 10b from empty cavity 10 or 10a to material loaded operation, i.e., the material B, Ba or Bb loaded operation is a small length perturbation from empty cavity 10a or 10b resonance. Experimental measurements of the axial distribution of $E_r$ at the cavity 10a or 10b walls with microcoax probes showed the presence of a spatially similar, $TM_{012}$ standing wave adjacent to the cavity 10a or 10b walls both with and without different material B, Ba or Bb loads. Finally, the exact numeral solutions for the cavity 10a or 10b field distributions with the lossy material present differ from the empty cavity 10a or 10b distributions only near the material B, Ba or Bb in the center of the cavity 10a or 10b (J. Rogers, Ph.D. Thesis, 1982, Michigan State University), i.e., the cavity 10a or 10b wall current distributions for the $TM_{012}$ mode change very little with the presence of the material B, Ba, or Bb.

Under the above mentioned conditions, the ratio of the radial electric field measured at a fixed position on the cavity 10a or 10b wall to the total power absorbed by the walls is a constant with and without a material B, Ba or Bb load, i.e., $$\frac{P_b}{|E_r|^2} = \text{constant} \tag{7}$$

Before heating and processing, complex dielectric constant of the cylindrical material B, Ba or Bb load was measured at room temperature using conventional low power swept frequency measurements of applicator 100 or 100a quality factor and resonant frequency with and without the material B, Ba or Bb load. The initial room temperature complex dielectric constant was then determined from equations (5) and (6).

Initial measurements also included the CW excitation of the empty cavity 10a or 10b at the processing frequency with a low power test signal $P_{to}$ and the simultaneous measurement of the radical electric field $/E_{ro}/^2$ when the cavity 10a or 10b was critically coupled. During this measurement, the applicator 100 or 100a was critically coupled at $\omega$ by adjusting $L_p$ and $L_s$. After recording this measurement, the material B, Ba or Bb load was placed exactly in the center of the applicator 100 or 100a and then $L_p$ and $L_s$ were readjusted for critical coupling at $\omega$. Input power was then raised to the desired level and material B, Ba or Bb heating began. As the material B, Ba or Bb load was heated, its properties changed which in turn detuned the cavity 10a or 10b. The applicator 100 or 100a was continuously tuned for zero reflected power during the heating cycle.

During heating, data points of cavity 10 or 10a length, probe 19 or 19a position, total power absorbed by the cavity, $P_t$, cavity field strength, $/E_r/^2$, were recorded at prespecified time intervals. Loaded cavity 10 or 10a quality factor was determined for each data point from the following equation $$Q_u = \frac{Q_o P_{to}}{|E_{ro}|^2} \frac{|E_r|^2}{P_t} \tag{8}$$

and cavity 10 or 10a wall losses were determined from $$P_b = \frac{|E_r|^2}{|E_{ro}|^2} P_{to} \tag{9}$$

Note, since both equations (8) and (9) require the ratios of the electric fields, only measurements of the relative magnitudes of electric field were necessary.

After completing a heating cycle, the material B, Ba or Bb were removed from the cavity 10 or 10a and the empty cavity 10 or 10a was returned to each separate data point position for $L_s$ and $L_p$. The empty cavity 10 or 10a resonance frequency $\omega_o$ was then measured for each experimental data point. Then using equations (5) and (6), the complex dielectric constant was determined. For very accurate calculations of empty cavity 10 or 10a measurements should be made under the same temperature and relative humidity conditions that were present during processing.

It is also useful to determine the efficiency of coupling microwave energy into a load material B, Ba or Bb. Thus, a system "figure of merit", called the overall coupling efficiency of the material loaded applicator 100 or 100a, is defined as $$(Eff)_1 = 100 \times \frac{P_a}{P_i} \tag{10}$$

where $P_i = P_r + P_t = P_r + P_a + P_b$. Viewing the applicator 100 or 100a as an impedance transformer and a focusing device, the ideal applicator 100 or 100a will deliver all the incident power into the material B, Ba or Bb with zero reflected power and applicator 100 or 100a wall loss power; i.e., $P_i = P_t = P_a$, $P_r$ and $P_b = 0$ and the overall coupling efficiency will then be 100%. In all experiments reported here the reflected power can be reduced to a very small value by tuning adjustments, i.e., $P_r << P_i$. Then the overall coupling efficiency is equal to just the applicator coupling efficiency $(Eff)_2$ i.e., $$(Eff)_2 = 100 \times \frac{P_a}{P_t} = 100 \times \frac{P_a}{P_a + P_b} = 100 \left[ 1 - \frac{Q_u}{Q_o} \right] \quad (11)$$

EXPERIMENTAL RESULTS

The experimental performance for several, simple, well understood materials B, Ba or Bb is presented below and demonstrates applicator 100 or 100a operation with a wide range of material loads. These materials are nylon, wet wood, water cylinders, and a three inch silicon wafer. Nylon is a relatively lossyless material, wet wood is moderately lossy, water is very lossy with a high dielectric constant (~80), and the silicon wafer demonstrates operation with a thin semiconducting material.

The applicators 100a were experimentally demonstrated using the experimental set up of FIG. 5. Cylindrical material rods were heated by placing them in the center of the applicator 100 of FIG. 3 and by exciting the cavity with the $TM_{012}$ mode as shown in FIG. 7. Material slabs or thin disks were placed at the end of the cavity applicator 100a as shown in FIG. 4 and were excited with either the TM or TE modes. These materials loads were either placed directly on the applicator fixed short 13 or 13a or were placed on thin teflon supports (not shown). The experimentally measured variations of material temperature, coupling efficiency and, when possible, complex dielectric constant are summarized below for each material load.

NYLON

Nylon 66 cylinders of length 3.1 cm and radius 0.65 cm were heated and diagnosed with the same exciting $TM_{012}$ electromagnetic fields. A fiber optic temperature probe was placed parallel to the cotton thread and was inserted axially through a small tightly fitting hole into the center of the nylon cylinder. Thus, the internal temperature of the nylon was measured as the microwave energy was applied.

The nylon cylinder was placed exactly in the center of the applicator 100 and the room temperature complex dielectric constant was measured with very low microwave power levels using standard cavity perturbation techniques. The room temperature dielectric constant agreed with published data (S. Li, C. Akyel and R. G. Bosisio, IEEE Trans. Microwave Theory, MTT-29, 1041 (1981)). Then microwave power was increased and the applicator was continuously tuned to a match. The measurement technique outlined in the previous section was used to evaluate applicator performance and material properties. That is, during heating, data points of cavity length and probe 19 positions, incident power, cavity $/E_r/^2$ field strength and nylon temperature were recorded at one minute intervals. $L_p$ and $L_s$ positions were measured to within one-tenth of a millimeter and frequency was measured to within a tenth of a MHz.

FIGS. 8A and 8B display the measured nylon complex dielectric constant vs. time and FIGS. 9A and 9B display the same data plotted vs. the measured temperature. The results for two typical heating cycles of 3 W and 5 W applied to two different nylon cylinders are displayed in each Figure. As shown, nylon changes from a relatively low loss to a very lossy dielectric as heating progresses. In fact, the shape of the $\epsilon_r''$ curves indicates the potential for thermal runaway (H. F. Huang, J. Microwave Power, 11, 305 (1976); and G. Roussy, A. Mercier, J. Thiebunt and J. Vaubourg, J. Microwave Power, 47 (1985)). Data for nylon 66 available from the literature (H. F. Huang, J. Microwave Power, 11, 305 (1976)) is also displayed in FIG. 10 and show good agreement, i.e. within several percent with measured data below the softening temperature (~65° C.) of nylon 66. At higher temperatures the accuracy of the measured data decreases presumably due to the nylon rod thermal expansion and deformation, and changes in the cavity wall temperature and cavity air temperature, and humidity. Coupling efficiency calculated using equation (9) begins at 40% at room temperature and time t=0, and gradually increases to 85-95% at the end of the heating cycle.

FIGS. 8A, 8B, 9a and 9B clearly demonstrate that changes in input power of only a few watts dramatically alters the heating cycle. The dielectric constant follows a different "path" vs. time for different input powers. In fact, experiments with larger input powers of $\gtrsim 10$ W (data points not shown) lead to the explosive destruction of the nylon rod due to non-uniform overheating due to thermal runaway in the center of the nylon. On-line measurement of the nylon complex dielectric constant provides knowledge of material heating and material properties (note the relationship between temperature and $\epsilon_r'$ of FIGS. 9A and 9B, and thus can be used as a feedback signal for process control. Using these on-line measurements the heating cycle is adjusted to prevent material destruction and to yield processed materials with the desired properties.

WET WOOD

The drying of paper and wet wood is an old use of microwave energy. Here the single mode applicator 100 is demonstrated by drying water soaked wood rods. The results of drying experiments, which were similar to the above described nylon heating experiments, are displayed in FIGS. 10 to 12. Complex dielectric constant of the wood material B was measured vs. time for 5 w and 8 W drying cycles. Also displayed is the coupling efficiency vs. time as the water is driven from the wood. Note that initially the overall coupling efficiency is high (~90%) and decreases (to 70%) as drying progresses. Its variation with time depends on the actual heating cycle chosen. These experiments clearly show that as the wood is dried, the division of the constant input power $P_t$, varies between the wet wood and the cavity walls; i.e., as the wood load becomes drier, and hence less lossy, more power is supplied to the cavity walls. As drying takes place the wet wood complex dielectric constant converges to the dry $\hat{\epsilon}$.

The initial weight $W_o$, and final weight $W_f$, of the wood rods and the total energy supplied to the applicator during the heating time were recorded in each experimental run. Thus, the drying efficiency, i.e., the ratio of the total energy input into the applicator to the total energy required to evaporate water of weight $W = W_o - W_f$, was calculated, as indicated in FIG. 12, for two different twelve minute drying cycles. Over this period the drying efficiency of the 5 W run is 60% while that of the 8 W run is 50%. The experimental data for $\epsilon_r''$ indicates that when 8 W is applied the wood is dry after nine minutes. If the drying cycle for 8 W is then stopped at 9 minutes the drying efficiency improves to 66%. It is clear that on-line measurement of $\epsilon$ during the actual drying process can be used as a method of process monitoring and provides information for process control and optimization.

WATER CYLINDERS

Cylindrical, one mm thick, quartz tubes with an inside diameter of 0.205 cm and a length of 4.2 cm were filled with distilled water and were hung from a cotton thread in the center of the applicator 100 as shown in FIG. 3. Using several constant input power levels of 1 W, 1.5 W, 2 W etc, the manually matched water samples were heated to a boil by excitation with the $TM_{012}$ mode. Experimental measurements similar to those described for nylon and wood were taken as the water temperature was increased from room temperature to boiling.

As is well known, it is not possible to accurately measure $\hat{\epsilon}$ for the large volumes of water used in these experiments by using cavity perturbation theory (S. Li, C. Akyel and R. G. Bosisio, IEEE Trans. Microwave Theory, MTT-29, 1041 (1981)). However, measurements were repeatable and provided information on the state of water heating. Typical results for several experimental runs for $\epsilon_r''$ vs. temperature are shown and compared with published data (A. R. Von Hippel, Dielectric Materials and Applications (MIT Press, Cambridge, MA. 1954), pp. 361) in FIG. 13.

Overall microwave coupling efficiency varied from 91% at the beginning of the heating to 82% at boiling, 5 minutes later. These results are very good for such small water samples. Larger samples will yield higher coupling efficiencies since loaded Q is proportional to material volume.

SEMICONDUCTOR WAFERS

Earlier experiments concerned with oxidation of silicon in a microwave plasma disk reactor (T, Roppel, D. K. Reinhard and J. Asmussen, J. Vac. Sci. Technol. B4, 195 (1986)) noted that in the absence of a microwave discharge a small silicon wafer could be quickly heated with microwave energy to cherry red (~900° C.) in a single mode cavity applicator (T. Roppel, PhD Thesis 1986, Michigan State University). Investigating this phenomenon further a three inch wafer Ba was placed in atmospheric air on a 3 mm thick ring of teflon placed on the end plate 13a of the cavity 10a applicator 100a shown in FIG. 4. The applicator 100a was excited and continuously manually matched in the $TE_{111}$ mode. FIG. 14 displays the temperature vs. time for this wafer Ba excited with 19.5 W and 37 W of input power. The initial rate of change of wafer Ba temperature was 94° C./min for 19.5 W input and 172° C./min for 37 W and is thus proportional to the power absorbed in the cavity 10a. The wafer 13a temperature quickly reached 240° C. (the maximum of the fiber optic 114 measurement system) with only 37 W of input power. Much higher steady state temperature are possible with higher input powers. At room temperature the skin depth for the electromagnetic field in silicon is ~2.6 mm and thus good electromagnetic field penetration into the 0.4 mm thick wafer is possible. These experiments clearly demonstrate that these applicators 100a can couple to thin semiconducting materials Ba, increasing the material Ba temperature to very high values. Thus these applicators can be used as processing controlled high temperature, efficient, electric furnaces.

CONCLUSIONS

When considering design criteria, such as high coupling efficiency, process controlability and heating uniformity, the single mode (or controlled multimode) cavity applicator has important advantages over conventional multimode applicators. For example, heating uniformity and control can be achieved by placing material B, Ba or Bb representing the load in the proper position in the single mode exciting fields. This placement of the load in an electromagnetic focused zone inside the applicator 100 or 100a also improves the coupling efficiency of the applicator 100 or 100a. Since applicator 100 or 100a walls can be made of highly conductive material (and can even be cooled to very low temperatures), the unloaded cavity applicator 100 or 100a can be designed as a high Q device and thus a high percentage of the input energy is transferred to the load. By using internal cavity 10 or 10a matching and single mode excitation the applicator 100 or 100a can be matched to the feed transmission line 111 throughout the processing cycle and all the incident power is coupled into the applicator 100 or 100a and is distributed between the material B, Ba or Bb load and the conducting applicator 100 or 100a walls.

The experiments described demonstrated that single mode cavity 10 or 10a applicators 100 or 100a can efficiently couple microwave energy into a wide range of material B, Ba or Bb loads. Material B, Ba or Bb loads ranging from low lossy, such as nylon, to very lossy, such as water, and semiconducting materials, such as silicon wafers, were efficiently heated. Overall coupling efficiencies of 70–95% were measured, using brass applicators 100 or 100a.

The use of single mode excitation has the benefit of allowing on-line diagnosis of material B, Ba or Bb properties during processing. Processing of epoxies, graphites and other composite materials, thin conducting and semiconducting materials and even biological materials can be accomplished by the method of the present invention. If high accuracy is desired, microwave power sources with good frequency stability (<0.1 MHz) are required, and applicator 100 or 100a and material B, Ba or Bb size variations with temperature must be taken into account.

Results

The Examples demonstrate the ability of the method of the present invention to precisely control the heating of materials B, Ba or Bb. Many variables such as input power control, tuning control, excitation frequency control (instead of applicator length tuning) are available as process control variables. In addition, other system variables such as cavity 10 or 10a electric field strength (and hence material B, Ba or Bb field strength), cavity 10 or 10a size, etc. are also available as process system feedback signals for an automated, intelligent processing system.

Design concepts employed in cavity 10a or 10b applicator 100 or 100a construction can be generalized to rectangular cavities and can also be scaled with frequency. The cavity 10 or 10a applicator 100 or 100a concepts have been demonstrated, at 2.45 GHz in the Examples. However, larger material B, Ba or Bb loads can be processed by simply scaling the applicator 100 or 100a design to lower excitation frequencies. For example, by reducing the excitation frequency to 915 MHz or to 400 MHz, the material B, Ba or Bb load sizes can be increased by three to five times.

It is intended that the foregoing description be only illustrative and that the present invention be limited only by the hereinafter appended claims.

I claim:

1. A method of heating of an initially liquid of solid material with a complex dielectric constant which changes as a function of radiofrequency heating over the heating time which comprises:
    (a) providing a radiofrequency wave generating apparatus including a metallic radiofrequency wave cavity which is excited in one or more of its pre-selected material loaded modes of resonance as a single mode or controlled multimode in the cavity around an axis of the cavity so that there is pre-selected heating of the liquid or solid material in the cavity including moveable plate means in the cavity mounted perpendicular to the axis in the cavity with electrical contacts around an outside edge of the plate which contact the cavity, moveable probe means connected to and extending inside the cavity for coupling the radiofrequency wave to the cavity and control means for moving the probe and plate in order to select and control the mode of the radiofrequency wave in the cavity;
    (b) heating a first of the liquid or solid material with an initial complex dielectric constant positioned in the cavity in a precisely oriented position in the cavity with the radiofrequency wave and maintaining the mode of the radiofrequency wave with the material in the cavity during the heating as a result of tuning by moving the probe or the plate or by varying the frequency or power of a source of the radiofrequency wave as the dielectric constant of the material changes during the heating wherein the mode in the cavity is maintained using measured incident and reflected power such that the reflected power from the cavity is continuously tuned to approximately zero in the cavity;
    (c) determining an optimum pattern of the tuning and power variation during the heating of the first of the liquid or solid material as a function of time in the cavity; and
    (d) repeating the pattern of the tuning and power variation of the power on an identical second of the liquid or solid material identically positioned in the cavity.

2. The method of claim 1 wherein the first and second materials are suspended in the chamber along the axis of the cavity on a length of material which is not materially affected by the radiofrequency wave.

3. The method of claim 1 wherein the first and second materials are positioned on a bottom portion of the cavity opposite the moveable plate and on the axis of the cavity.

4. The method of claim 1 wherein the first and second materials are solid, wherein a portion of the material is volatilized during the heating and wherein the cavity is vented.

5. The method of claim 1 wherein a bottom portion of the cavity opposite the moveable plate is removable so that the first and second materials can be positioned in the cavity by removing the bottom portion.

6. The method of claim 1 wherein the cavity is provided with an access opening perpendicular axis for inserting a probe to determine electric or magnetic field strengths adjacent to the cavity walls as a function of time.

7. The method of claim 1 wherein an opening is provided perpendicular to the axis of the cavity which is covered by a metal screen for viewing the heating of the material.

8. A method of heating of an initially liquid or solid material with a complex dielectric constant which changes as a function of radiofrequency heating over the heating time which comprises:
    (a) providing a radiofrequency generating apparatus including a metallic radiofrequency wave cavity which is excited in one of its pre-selected material loaded modes of resonance as a single mode or controlled multimode in the cavity around an axis of the cavity so that there is pre-selected heating of the material in the cavity including moveable plate means in the cavity mounted perpendicular to the axis in the cavity with electrical contacts around an outside edge of the plate which contact the cavity, moveable probe means connected to and extending inside the cavity for coupling the radiofrequency wave to the cavity and control means for moving the probe and plate in order to select and control the mode of the radiofrequency wave in the cavity;
    (b) heating the material with an initial complex dielectric constant positioned in the cavity in a precisely oriented position in the cavity with the radiofrequency wave and maintaining the mode of the radiofrequency wave during the heating by moving the probe or the plate or by varying the frequency or power of a source of the radiofrequency wave as the dielectric constant of the material changes during the heating wherein the mode in the cavity is maintained during the heating using measured incident and reflected power initially as a function of time during the heating of the material in the cavity such that the reflected power from the cavity is continuously tuned to approximately zero and wherein the cavity Q, cavity field strength and the incident power and reflected power are measured initially with an empty critically coupled cavity and during the heating of the material at one position in the cavity; and
    (c) calculating the complex dielectric constant of the material as a function of time in the cavity using the measurements taken at pre-selected times during heating of field strength used for the heating, incident and reflected power and the probe and the plate position with the material in the cavity and with the empty cavity.

9. The method of claim 8 wherein the material is suspended on a length of material which is not materially affected by the radiofrequency wave.

10. The method of claim 8 wherein the material is positioned on a bottom portion of the cavity opposite the moveable plate and on the axis of the cavity.

11. The method of claim 8 wherein a bottom portion of the cavity opposite the moveable plate is removable so that the material is positioned in the cavity by removing the bottom portion.

12. The method of claim 8 wherein the cavity is provided with an access opening perpendicular to the axis for inserting a probe to determine the electric or magnetic field strengths adjacent to the cavity walls as a function of time.

13. The method of claim 8 wherein the material is partially volatilized during the heating and wherein the cavity is vented.

14. The method of claim 8 wherein the material is solid prior to heating.

15. A method of heating of an initially liquid or solid material with a complex dielectric constant which changes as a function of radiofrequency heating over the heating time which comprises:

(a) providing a radiofrequency wave generating apparatus including a metallic radiofrequency wave cavity which is excited in one or more of its preselected material loaded modes of resonance as a single mode or controlled multimode in the cavity around an axis of the cavity so that there is preselected heating of the material in the cavity including moveable plate means in the cavity mounted perpendicular to the axis in the cavity with electrical contacts around an outside edge of the plate which contact the cavity, moveable probe means connected to and extending inside the cavity for coupling the radiofrequency wave to the cavity and control means for moving the probe and plate in order to select and control the mode of the radiofrequency wave in the cavity; and (b) heating the liquid or solid material with an initial complex dielectric constant positioned in the cavity in a precisely oriented position in the cavity with the radiofrequency wave and maintaining the mode of the radiofrequency wave with the material in the cavity during the heating through measurements of the magnetic or electric field strength perpendicular to the axis of the cavity as a result of tuning by moving the probe or the plate or by varying the frequency or power of a source of the radiofrequency wave as the dielectric constant of the material changes during the heating, wherein the mode in the cavity is maintained using measured incident and reflected power such that the reflected power from the cavity is continuously tuned to approximately zero in the cavity and the incident power is tuned to a desired level in the cavity.

16. The method of claim 15 wherein the cavity is circular in cross-section along the axis.

* * * * *

UNITED STATES PATENT AND TRADEMARK OFFICE
CERTIFICATE OF CORRECTION

PATENT NO. : 4,777,336

DATED : October 11, 1988

INVENTOR(S) : Jes Asmussen

Page 1 of 3

It is certified that error appears in the above—identified patent and that said Letters Patent is hereby corrected as shown below:

Column 2, line 28 "r" should be --$\vec{r}$--.

Column 2, line 39 "r" should be --$\vec{r}$--.

Column 2, line 45 "$\epsilon$" should be --$\hat{\epsilon}$--.

Column 2, line 47 "E(r)" should be --$\vec{E}(\vec{r})$--.

Column 2, line 53 "$\epsilon=f(\omega,E,T_M,r)$." should be --$\epsilon=f(\omega,\vec{E},T_M,\vec{r})$.--.

Column 2, line 55 "E" should be --$\vec{E}$--.

Column 3, line 18 "$\epsilon(r)$" should be --$\hat{\epsilon}(\vec{r})$--.

Column 3, line 19 "$|E|$" should be --$|\vec{E}|$--.

UNITED STATES PATENT AND TRADEMARK OFFICE
CERTIFICATE OF CORRECTION

PATENT NO. : 4,777,336

DATED : October 11, 1988

INVENTOR(S) : Jes Asmussen

It is certified that error appears in the above—identified patent and that said Letters Patent is hereby corrected as shown below:

Column 4, line 2 "mulimode" should be --multimode--.

Column 4, line 48 "vew" should be --view--.

Column 6, line 48 before "$TE_{011}$" insert --$TE_{211}$,--.

Column 7, line 46 "B,$B_a$ or $B_b$" should be --B, $B_a$ or $B_b$--.

Column 7, lines 54, 57, 58 "$B_a$ or $B_b$" should be --$B_a$ or $B_b$--.

Column 9, line 52 "penetratin" should be --penetration--.

Column 10, line 38 "pertubation" should be --perturbation--.

Column 11, line 22 "lower" should be --low--.

Column 11, line 47 "numeral" should be --numerical--.

Column 12, line 7 "radical" should be --radial--.

Column 12, line 43 "were" should be --was--.

Column 12, line 49 before "empty" insert --$\hat{\epsilon}$--.

UNITED STATES PATENT AND TRADEMARK OFFICE
CERTIFICATE OF CORRECTION

PATENT NO. : 4,777,336
DATED : October 11, 1988
INVENTOR(S) : Jes Asmussen

It is certified that error appears in the above—identified patent and that said Letters Patent is hereby corrected as shown below:

Column 14, line 23 "9a" should be --9A--.

Column 14, line 48 "5w" should be --5W--.

Column 15, line 5 "$\epsilon$" should be --$\hat{\epsilon}$--.

Column 16, line 1 "temperature" should be --temperatures--.

Column 17, line 9 "of" should be --or--. (3rd occurrence)

Signed and Sealed this

Eighteenth Day of April, 1989

*Attest:*

DONALD J. QUIGG

*Attesting Officer*   *Commissioner of Patents and Trademarks*